United States Patent [19]
Sato et al.

[11] Patent Number: 5,910,222
[45] Date of Patent: *Jun. 8, 1999

[54] BISMUTH OXIDE SUPERCONDUCTOR AND METHOD OF PREPARING THE SAME

[75] Inventors: Kenichi Sato; Takeshi Hikata, both of Osaka, Japan

[73] Assignee: Sumitomo Electric Industries, Ltd, Japan

[*] Notice: This patent is subject to a terminal disclaimer.

[21] Appl. No.: 08/858,842

[22] Filed: May 19, 1997

Related U.S. Application Data

[62] Division of application No. 08/283,498, Aug. 1, 1994, Pat. No. 5,670,459, which is a continuation of application No. 07/670,124, Mar. 15, 1991, abandoned.

[30] Foreign Application Priority Data

| Mar. 16, 1990 | [JP] | Japan | 2-67934 |
| Mar. 27, 1990 | [JP] | Japan | 2-80421 |

[51] Int. Cl.$^6$ .................................................. H01L 39/24
[52] U.S. Cl. ............................................................ 148/96
[58] Field of Search .............................. 148/96; 505/433, 505/492, 501, 739, 742

[56] References Cited

U.S. PATENT DOCUMENTS

| 5,057,486 | 10/1991 | Arendt et al. | 505/782 |
| 5,114,909 | 5/1992 | Shi | 505/782 |
| 5,204,316 | 4/1993 | Arendt et al. | 505/433 |
| 5,208,215 | 5/1993 | Chen et al. | 148/96 |
| 5,236,891 | 8/1993 | Hikata et al. | 505/433 |
| 5,508,254 | 4/1996 | Sato et al. | 505/742 |
| 5,610,123 | 3/1997 | Sato et al. | 505/501 |
| 5,716,909 | 2/1998 | Majewski et al. | 505/739 |
| 5,744,427 | 4/1998 | Torii | 505/492 |

OTHER PUBLICATIONS

Mimura, M., et al., "Improvement of the Critical Current Density in the Silver Sheathed Bi—Pb—Sr—Ca—Cu—O Superconducting Tape," *Applied Physics Letters,* Apr. 1989, pp. 1582–1584.

Hikata, T., et al., "Electromagnetics Properties and Morphology of Ag–Sheathed Bi—Pb—Sr—Ca—Cu—O Superconducting Wires," *Japanese Journal of Applied Physics,* Jul. 1989, pp. L1204–L1206.

*Primary Examiner*—George Wyszomierski
*Attorney, Agent, or Firm*—Pennie & Edmonds LLP

[57] ABSTRACT

In a bismuth oxide superconductor having a composition of Bi—Sr—Ca—Cu or (Bi,Pb)—Sr—Ca—Cu and being covered with a metal sheath, the a-b plane of a 2223 phase, which is a 110 K phase, is oriented along the longitudinal direction as a matrix, while a dispersed superconducting phase mainly consisting of a 2212 phase, which is a 80 K phase, and/or non-superconducting phases is dispersed along the a-b plane in the 2223 phase, so that a magnetic field property of its critical current density is extremely improved. In order to prepare such a bismuth oxide superconductor, performed are the steps of preparing raw material which is based on a 2223 composition in. Bi—Sr—Ca—Cu or (Bi,Pb)—Sr—Ca—Cu in relation to blending/composition, consisting as a superconducting phase of mainly a 2212 phase and non-superconducting phases in relation to the crystal structure, covering the raw material with a metal sheath, and performing deformation processing and heat treatment on the composite.

4 Claims, No Drawings

BISMUTH OXIDE SUPERCONDUCTOR AND METHOD OF PREPARING THE SAME

This is a division of application Ser. No. 08/283,498, filed Aug. 1, 1994, now U.S. Pat. No. 5,670,459, which is a FWC of prior application Ser. No. 07/670,124, filed Mar. 15, 1991, now abandoned.

BACKGROUND OF THE INVENTION

1. Field of the Invention

The present invention relates to a bismuth oxide superconductor and a method of preparing the same, and more particularly, it relates to improvement for a magnetic field property of critical current density in a bismuth oxide superconductor.

2. Description of the Background Art

In recent years, superconducting materials of ceramics, i.e., oxide superconducting materials, are watched as materials which exhibit higher critical temperatures.

For example, a bismuth oxide superconductor, which exhibits a high critical temperature of about 110 K, is expected as a practicable superconducting material.

It is known that a bismuth oxide superconductor has a phase showing a critical temperature of 110 K and those showing critical temperatures of 80 K and 10 K. It is also known that a non-superconducting phase partially appears particularly when a superconductor of a 110 K phase is prepared.

In relation to such a bismuth oxide superconductor, it is further known that the 110 K phase has a 2223 composition in a composition of Bi—Sr—Ca—Cu or (Bi,Pb)—Sr—Ca—Cu, while the 80 K phase has a 2212 composition in the same composition.

In order to apply a superconductor to a cable or a magnet, it is necessary to attain a high critical current density, in addition to a high critical temperature. In particular, it is necessary to ensure a required critical current density in the magnetic field which is applied to the superconductor.

However, a conventional bismuth oxide superconductor is rather inferior in magnetic field property of critical current density. Particularly when the magnetic field is applied in parallel with the c-axis, the critical current density is significantly lowered.

SUMMARY OF THE INVENTION

Accordingly, an object of the present invention is to provide a bismuth oxide superconductor which is improved in critical current density under magnetic field, and a method of preparing the same.

A bismuth oxide superconductor according to the present invention basically-contains components of Bi—Sr—Ca—Cu, or (Bi,Pb)—Sr—Ca—Cu with partial substitution of Pb for Bi. Such a superconductor mainly consists of a 2223 phase of a 2223 composition of the aforementioned components, which has a longitudinal direction with its a-b plane being oriented in the longitudinal direction. This 2223 phase is a 110 K phase. In order to solve the aforementioned technical problem in such a bismuth oxide superconductor, the present invention is characterized in that a dispersed phase mainly consisting of a 2212 phase (superconducting phase), which is a 80 K phase of a 2212 composition of the aforementioned bismuth components, and/or non-superconducting phases is dispersed in parts of the aforementioned 2223 phase as a matrix.

Preferably the superconducting phase mainly consisting of the 2212 phase and/or the non-superconducting phase is two-dimensionally oriented along the a-b plane of the 2223 phase as a matrix.

In generally the non-superconducting phase is simultaneously (i.e., in-situ) formed with formation of the 2223 phase. Such a non-superconducting phase may have a composition such as Sr—Ca—Cu—O, (Ca,Sr)—Pb—O or Ca—Cu—O. The non-superconducting phases of such a composition can enter a dispersed state by itself on the spot.

In general, the inventive bismuth oxide superconductor is prepared in a state covered with a metal sheath. Therefore, the inventive method of preparing a bismuth oxide superconductor is carried out using a metal sheath. In more concrete terms, the inventive method comprises the steps of:

preparing powder which is based on a 2223 composition of Bi—Sr—Ca—Cu or (Bi,Pb)—Sr—Ca—Cu, consisting as a superconducting phase of mainly a 2212 phase of a 2212 composition of Bi—Sr—Ca—Cu or (Bi,Pb)—Sr—Ca—Cu and non-superconducting phases in parts, covering the powder with a metal sheath, and performing deformation processing and heat treatment on the composite. A temperature provided in the step of heat treatment is selected to be higher than that for dominantly forming the 2223 phase of the 2223 composition.

Preferably the step of deformation processing and heat treatment is repeated plural times.

The powder filling up the metal sheath is preferably brought into a submicron state, in order to refine the dispersed superconducting phase and/or non-superconducting phases.

A method of preparing a bismuth superconductor according to another aspect of the present invention comprises the steps of:

preparing raw material which is based on a 2223 composition of Bi—Sr—Ca—Cu or (Bi,Pb)—Sr—Ca—Cu in relation to blending/composition, consisting as a superconducting phase of mainly a 2212 phase and a non-superconducting phase in relation to the crystal structure, covering the raw material with a metal sheath, and performing deformation processing and heat treatment on the composite. The step of performing heat treatment is carried out at an end point temperature of a partial fusion reaction of the raw material.

When the temperature of a bismuth oxide superconducting material, which is covered with a metal, is raised to fuse the portion of raw material, three types of fusion reactions are generally successively observed from endothermic peaks. The present invention is adapted to use the first one of the three types of fusion reactions, i.e., a partial fusion reaction. When start and end point temperatures of such a partial fusion reaction are 840° C. and 850° C. respectively, for example, the end point temperature of 850° C. is applied in the step of heat treatment according to the present invention.

In a conventional method, an intermediate temperature between start and end point temperatures has been generally used in a step of performing heat treatment. In this case, it is impossible to obtain a bismuth oxide superconductor, to which the present invention is directed, but most part of the as-formed superconductor consists of a 110 K phase, i.e., a 2223 phase. Such a superconductor has no dispersion of a superconducting phase mainly consisting of a 2212 phase and a non-superconducting phase along the a-b plane of the 2223 phase, and hence it is impossible to greatly improve the magnetic field property of critical current density.

According to the inventive method, as hereinabove described, it is possible to obtain such a bismuth oxide superconductor that the a-b plane of a 2223 phase, i.e., a 110 K phase, is oriented along the longitudinal direction while a superconducting phase mainly consisting of a 2212 phase, i.e., a 80 K phase, and/or a non-superconducting phase is dispersed along the a-b plane of the 2223 phase.

Therefore, according to the present invention, it is possible to obtain a bismuth oxide superconductor, which exhibits a high critical current density under a magnetic field. Thus, such a superconductor can be applied to a cable or a magnet, with no problem.

DESCRIPTION OF THE PREFERRED EMBODIMENTS

The inventive method is carried out as follows, for example:

First prepared is raw material having components of Bi—Sr—Ca—Cu or (Bi,Pb)—Sr—Ca—Cu, based on a 2223 composition, in which a superconducting phase mainly consisting of a 2212 phase and a non-superconducting phase are dispersed.

This raw material is filled up in a silver pipe, for example. The composite, which is filled up with the raw material, is drawn or drawn and rolled, then heat treated, and again rolled and heat treated, to obtain a target bismuth oxide superconductor. Before the final heat treatment, drawing may be performed in place of rolling.

The temperature for the above heat treatment is preferably selected to be at an end point temperature of a partial fusion reaction of the raw material for the bismuth oxide superconductor. Thus, it is possible to obtain a 2223 phase (110 K) superconductor as a matrix, with dispersions of a 2212 phase and/or non-superconducting phases. This temperature condition is slightly higher than a temperature for dominantly forming a 2223 phase. The raw material, which is filled up in the silver pipe, is preferably brought into a state of submicron powder, in order to refine the dispersed superconducting phase and/or non-superconducting phase.

The heat treatment temperature cannot be univocally determined since the optimum temperature depends on the heat treating atmosphere. When the oxygen partial pressure of the heat treating atmosphere is lowered, for example, the partial fusion reaction is caused in a wide temperature range, whereby temperature control is facilitated and the end point temperature is rather lowered.

The metal sheath can be formed of any material so far as the same is not reactive with the superconducting material and has excellent workability. In place of the aforementioned silver, the metal sheath may be prepared from a silver alloy, gold, or a gold alloy, for example. Alternatively, only a surface, which is brought into contact with the superconducting material, of the metal sheath may be covered with a layer of such a metal. The metal sheath preferably serves as a stabilizer under conditions for using the superconductor.

The deformation processing includes drawing and rolling, for example. In order to improve the critical current density, the deformation ratio is preferably at least 80% in drawing as well as in rolling. The step of such deformation processing and heat treatment is preferably repeated plural times in order to effectively improve the critical current density. When rolling is performed plural times, for example, the deformation ratio in a single pass is preferably at least 40%. When rolling or drawing is again performed after the heat treatment, the deformation ratio of 10% to 30% may be sufficient in such processing. The rolling is performed with a roll or a press, for example.

Experimental Examples carried out on the basis of the present invention are now described.

EXPERIMENTAL EXAMPLE 1

$Bi_2O_3$, Pb, $SrCO_3$, $CaCO_3$ and CuO were blended so that Bi, Pb, Sr, Ca and Cu were in composition ratios of 1.89:0.43:2.04:2.25:3.07. This blend was heat treated at 700° C. for 12 hours and at 800° C. for 8 hours in the atmosphere, and then at 760° C. for 8 hours in a decompressed atmosphere of 1 Torr, in this order. The blend was pulverized after each heat treatment. The as-obtained powder was further pulverized with a ball mill, to obtain submicron powder. This submicron powder was degassed at 800° C. for 10 minutes under a decompressed atmosphere The as-formed powder was filled up in a silver pipe of 12 mm in diameter (outer diameter). This silver pipe was drawn into a diameter of 1 mm, and further rolled into a thickness of 0.18 mm.

Then the pipe was heat treated at 850° C. for 50 hours, again rolled into a thickness of 0.14 mm, and then heat treated at 840° C. for 50 hours.

The as-formed tape-type wire exhibited a critical current density of 36000 $A/cm^2$ with application of no external magnetic field, while it exhibited a critical current density of 10000 $A/cm^2$ when a magnetic field of 0.5 T was applied perpendicularly to the tape surface.

This wire was investigated by X-ray diffraction and with a scanning electron microscope. A 2212 phase was recognized by X-ray diffraction, while a large amount of non-superconducting phases, which were simultaneously (i.e., in-situ) formed on the spot, were observed with the electron microscope. These non-superconducting phases were two-dimensionally observed along grain boundaries of a 2223 phase as a matrix, whose a-b plane was oriented in the longitudinal direction. The a-b plane of the 2212 phase was continuously oriented in the longitudinal direction, similarly to the 2223 phase.

COMPARATIVE EXAMPLE

A tape-type wire was prepared through similar steps to Experimental Example 1, except for that the silver pipe was heat treated at 845° C. for 50 hours after the same was rolled into a thickness of 0.18 mm.

The as-formed tape-type wire exhibited a critical current density of 25000 $A/cm^2$ with application of no external magnetic field, while it exhibited a critical current density of 1000 $A/cm^2$ when a magnetic field of 0.5 T was applied perpendicularly to the tape surface.

Similarly to Experimental Example 1, the comparative wire was investigated by X-ray diffraction and with a scanning electron microscope. No 2212 phase was observed by X-ray diffraction, while only a small amount of non-superconducting phases, which were simultaneously (i.e., in-situ) formed on the spot, were observed at a rate of about 10% of the sectional area. These phases were two-dimensionally observed longitudinally along grain boundaries of an oriented 2223 phase.

EXPERIMENTAL EXAMPLE 2

$Bi_2O_3$, PbO, $SrCO_3$, $CaCO_3$ and CuO were blended so that Bi, Pb, Sr, Ca and Cu were in composition ratios of 1.80:0.38:1.96:2.21:3.02. This blend was heat treated at 700° C. for 12 hours and 800° C. for 8 hours in the atmosphere, and at 760° C. for 8 hours in a decompressed atmosphere of 1 Torr, in this order. The blend was pulverized after each heat treatment. The as-obtained powder was further pulverized with a ball mill, to obtain submicron powder. This submicron powder was degassed at 800° C. for 10 minutes in a decompressed atmosphere.

The as-formed powder was filled up in a silver pipe of 12 mm in diameter (outer diameter). This pipe was drawn into a diameter of 1 mm, and further rolled into a thickness of 0.17 mm.

A tape-type wire obtained, by such rolling was heat treated at 850° C., which was an end point temperature of a partial fusion reaction of the raw material powder, for 50 hours. Due to such heat treatment, the rest of a phase having a lower critical temperature is transformed into a phase having a higher critical temperature while leaving part of the phase having a lower critical temperature and a non-superconducting phase.

Then, the pipe was again rolled into a thickness of 0.13 mm, and heat treated at 845° C. for 50 hours. In the heat treatment of this stage, crystal grains of the phase having a higher critical temperature are grown and fused through grain boundaries thereof.

The as-formed tape-type wsre exhibited a critical current density of 38000 A/cm$^2$ with application of no external magnetic field, while it exhibited a critical current density of 13000 A/cm$^2$ when a magnetic field of 0.4 T was applied perpendicularly to the tape surface.

What is claimed is:

1. A method of preparing a bismuth oxide superconductor, comprising the steps of:

preparing a powder having components of Bi—Sr—Ca—Cu or (Bi,Pb)—Sr—Ca—Cu based on a 2223 composition of Bi—Sr—Ca—Cu or (Bi,Pb)—Sr—Ca—Cu; wherein said powder consists of a 2212 superconducting phase and/or at least one non-superconducting phase, said preparing step further comprising heat treating said powder at least once and pulverizing said powder thereafter;

covering said powder with a metal sheath; and performing deformation processing and heat treatment on said powder covered with said metal sheath, a temperature provided in said step of heat treatment being selected to be higher than that for dominantly forming a 2223 phase of said 2223 composition.

2. The method of preparing a bismuth oxide superconductor in accordance with claim 1 wherein said preparing step further comprises a degassing process conducted in a decompressed atmosphere.

3. A method of preparing a bismuth oxide superconductor comprising the steps of:

preparing a raw material including components of Bi—Sr—Ca—Cu or (Bi,Pb)—Sr—Ca—Cu based on a 2223 composition of Bi—Sr—Ca—Cu or (Bi,Pb)—Sr—Ca—Cu, said preparing step further comprising the steps of:

(a) performing at least one first heat treatment to said raw material;

(b) pulverizing said raw material after each heat treatment, and (c) conducting a degassing process to said raw material in a decompressed atmosphere, whereby said raw material prepared consists mainly of a 2212 superconducting phase and at least one non-superconducting phase;

covering said raw material with a metal sheath; and performing deformation processing and a second heat treatment on said metal sheath, wherein said second heat treatment is performed at an end temperature of a partial fusion reaction of said raw material.

4. The method of preparing a bismuth oxide superconductor in accordance with claim 3, wherein said temperature adopted in the second heat treatment is between 850° C. and 852° C.

* * * * *